(12) United States Patent
Xie et al.

(10) Patent No.: US 9,425,103 B2
(45) Date of Patent: Aug. 23, 2016

(54) METHODS OF USING A METAL PROTECTION LAYER TO FORM REPLACEMENT GATE STRUCTURES FOR SEMICONDUCTOR DEVICES

(71) Applicant: GLOBALFOUNDRIES Inc., Grand Cayman (KY)

(72) Inventors: Ruilong Xie, Niskayuna, NY (US); Chanro Park, Clifton Park, NY (US); Sean Xuan Lin, Watervliet, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/560,102

(22) Filed: Dec. 4, 2014

(65) Prior Publication Data
US 2016/0163601 A1   Jun. 9, 2016

(51) Int. Cl.
| H01L 21/8234 | (2006.01) |
|---|---|
| H01L 29/66 | (2006.01) |
| H01L 21/3213 | (2006.01) |
| H01L 21/02 | (2006.01) |
| H01L 29/51 | (2006.01) |
| H01L 29/423 | (2006.01) |
| H01L 29/49 | (2006.01) |
| H01L 27/088 | (2006.01) |

(52) U.S. Cl.
CPC .. *H01L 21/823468* (2013.01); *H01L 21/02181* (2013.01); *H01L 21/32133* (2013.01); *H01L 21/823456* (2013.01); *H01L 21/823462* (2013.01); *H01L 27/088* (2013.01); *H01L 29/42376* (2013.01); *H01L 29/495* (2013.01); *H01L 29/517* (2013.01); *H01L 29/6653* (2013.01); *H01L 29/66545* (2013.01)

(58) Field of Classification Search
None
See application file for complete search history.

(56) References Cited

U.S. PATENT DOCUMENTS

| 9,209,273 B1* | 12/2015 | Lin | H01L 29/66545 |
|---|---|---|---|
| 2011/0108928 A1* | 5/2011 | Tao | H01L 21/3215 257/410 |
| 2012/0139061 A1* | 6/2012 | Ramachandran | H01L 21/76895 257/410 |
| 2013/0187236 A1* | 7/2013 | Xie | H01L 29/4966 257/369 |
| 2015/0206963 A1* | 7/2015 | Ho | H01L 21/31111 257/411 |
| 2015/0243564 A1* | 8/2015 | Zhao | H01L 29/66545 438/591 |

* cited by examiner

*Primary Examiner* — Michael Jung
(74) *Attorney, Agent, or Firm* — Amerson Law Firm, PLLC

(57) ABSTRACT

A method that involves forming a high-k gate insulation layer, a work-function adjusting metal layer and a metal protection layer in first and second replacement gate cavities, wherein the metal protection layer is formed so as to pinch-off the first gate cavity while leaving the second gate cavity partially un-filled, forming a first bulk conductive metal layer in the un-filled portion of the second gate cavity, removing substantially all of the metal protection layer in the first gate cavity while leaving a portion of the metal protection layer in the second gate cavity, forming a second conductive metal layer within the first and second replacement gate cavities, recessing the conductive metal layers so as to define first and second gate-cap cavities in the first and second replacement gate cavities, respectively, and forming gate cap layers within the first and second gate-cap cavities.

15 Claims, 9 Drawing Sheets

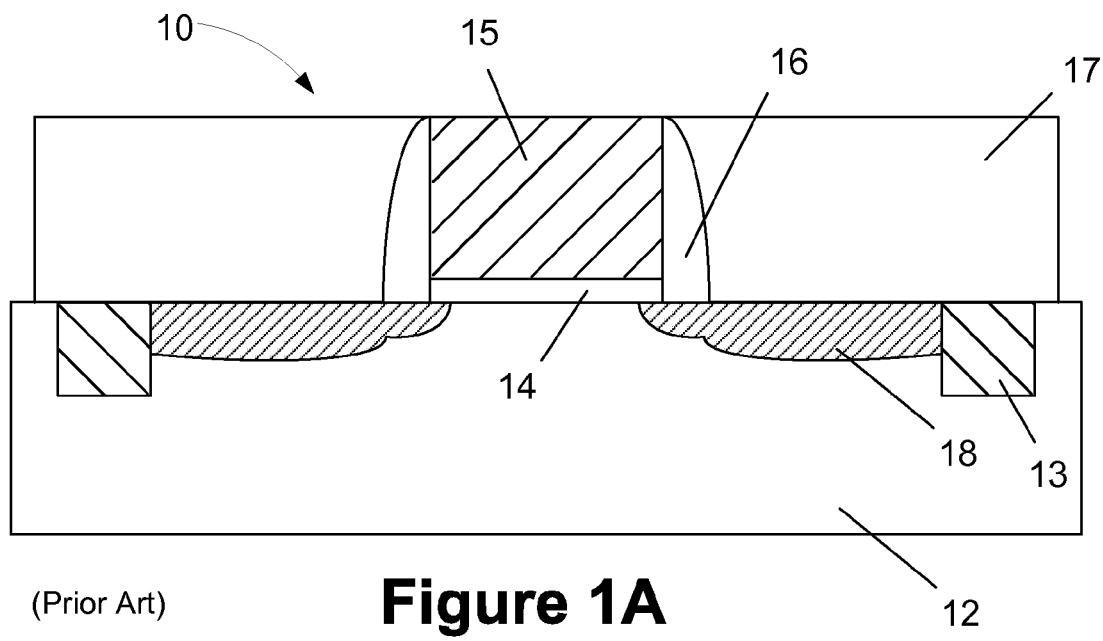
(Prior Art) Figure 1A
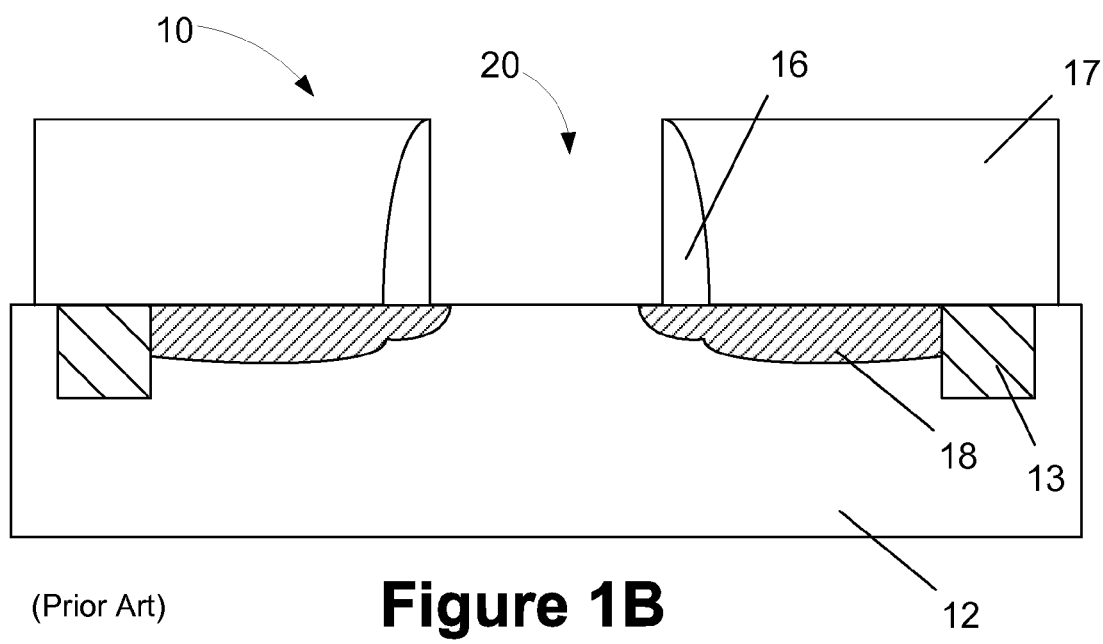
(Prior Art) Figure 1B

METHODS OF USING A METAL PROTECTION LAYER TO FORM REPLACEMENT GATE STRUCTURES FOR SEMICONDUCTOR DEVICES

BACKGROUND OF THE INVENTION

1. Field of the Invention

The present disclosure generally relates to the fabrication of integrated circuits, and, more particularly, to various methods of forming replacement gate structures for semiconductor devices, such as transistors, and the resulting semiconductor devices.

2. Description of the Related Art

In modern integrated circuits, such as microprocessors, storage devices and the like, a very large number of circuit elements, especially transistors, are provided on a restricted chip area. Transistors come in a variety of shapes and forms, e.g., planar transistors, FinFET transistors, nanowire devices, etc. Irrespective of the physical configuration of the transistor device, each device comprises drain and source regions and a gate electrode structure positioned above and between the source/drain regions. Upon application of an appropriate control voltage to the gate electrode, a conductive channel region forms between the drain region and the source region.

For many early device technology generations, the gate structures of most transistor elements (planar and FinFET devices) were comprised of a plurality of silicon-based materials, such as a silicon dioxide and/or silicon oxynitride gate insulation layer, in combination with a polysilicon gate electrode. However, as the channel length of aggressively scaled transistor elements has become increasingly smaller, many newer generation devices employ gate structures that contain alternative materials in an effort to avoid the short channel effects which may be associated with the use of traditional silicon-based materials in reduced channel length transistors. For example, in some aggressively scaled transistor elements, which may have channel lengths on the order of approximately 10-32 nm or less, gate structures that include a so-called high-k dielectric gate insulation layer (k-value of approximately 10 or greater) and one or more metal layers that function as the gate electrode have been implemented. Such alternative gate structures—typically known as high-k/metal gate structures (HK/MG structures)—have been shown to provide significantly enhanced operational characteristics over the heretofore more traditional silicon dioxide/polysilicon gate structure configurations.

One well-known processing method that has been used for forming a transistor with a high-k/metal gate structure is the so-called "gate last" or "replacement gate" technique. The replacement gate process may be used when forming planar devices or 3D devices. FIGS. 1A-1E simplistically depict one illustrative prior art method for forming an HK/MG replacement gate structure using a replacement gate technique on a planar transistor device. As shown in FIG. 1A, the process includes the formation of a basic transistor structure above a semiconducting substrate 12 in an active area defined by a shallow trench isolation structure 13. At the point of fabrication depicted in FIG. 1A, the device 10 includes a sacrificial gate insulation layer 14, a dummy or sacrificial gate electrode 15, sidewall spacers 16, a layer of insulating material 17 and source/drain regions 18 formed in the substrate 12. The various components and structures of the device 10 may be formed using a variety of different materials and by performing a variety of known techniques. For example, the sacrificial gate insulation layer 14 may be comprised of silicon dioxide, the sacrificial gate electrode 15 may be comprised of polysilicon, the sidewall spacers 16 may be comprised of silicon nitride and the layer of insulating material 17 may be comprised of silicon dioxide. The source/drain regions 18 may be comprised of implanted dopant materials (N-type dopants for NMOS devices and P-type dopants for PMOS devices) that are implanted into the substrate 12 using known masking and ion implantation techniques. Of course, those skilled in the art will recognize that there are other features of the transistor 10 that are not depicted in the drawings for purposes of clarity. For example, so-called halo implant regions are not depicted in the drawings, as well as various layers or regions of silicon/germanium that are typically found in high performance PMOS transistors. At the point of fabrication depicted in FIG. 1A, the various structures of the device 10 have been formed and a chemical mechanical polishing (CMP) process has been performed to remove any materials above the sacrificial gate electrode 15 (such as a protective cap layer (not shown) comprised of silicon nitride) so that at least the sacrificial gate electrode 15 may be removed.

As shown in FIG. 1B, one or more etching processes are performed to remove the sacrificial gate electrode 15 and the sacrificial gate insulation layer 14 to thereby define a replacement gate cavity 20 where an HK/MG replacement gate structure will subsequently be formed. Typically, the sacrificial gate insulation layer 14 is removed as part of the replacement gate technique, as depicted herein. However, the sacrificial gate insulation layer 14 may not be removed in all applications. Even in cases where the sacrificial gate insulation layer 14 is intentionally removed, there will typically be a very thin native oxide layer (not shown) that forms on the substrate 12 within the gate cavity 20.

Next, as shown in FIG. 1C, various layers of material that will constitute the HK/MG replacement gate structure 30 are formed in the gate cavity 20. The materials used for HK/MG replacement gate structures 30 for NMOS and PMOS devices are typically different. For example, the replacement gate structure 30 for an NMOS device may be comprised of a high-k gate insulation layer 30A, such as hafnium oxide, having a thickness of approximately 2 nm, a first metal layer 30B (e.g., a layer of titanium nitride with a thickness of about 1-2 nm), a second metal layer 30C—a so-called work function adjusting metal layer for the NMOS device—(e.g., a layer of titanium-aluminum or titanium-aluminum-carbon with a thickness of about 5 nm), a third metal layer 30D (e.g., a layer of titanium nitride with a thickness of about 1-2 nm), and a bulk metal layer 30E, such as aluminum or tungsten.

Ultimately, as shown in FIG. 1D, one or more CMP processes are performed to remove excess portions of the gate insulation layer 30A, the first metal layer 30B, the second metal layer 30C, the third metal layer 30D and the bulk metal layer 30E positioned outside of the gate cavity 20 to thereby define the HK/MG replacement gate structure 30 for an illustrative NMOS device. Typically, an HK/MG replacement gate structure 30 for a PMOS device does not include as many metal layers as does an NMOS device. For example, an HK/MG gate structure 30 for a PMOS device may only include the high-k gate insulation layer 30A, a single layer of titanium nitride—the work function adjusting metal for the PMOS device—having a thickness of about 3-4 nm, and the bulk metal layer 30E.

FIG. 1E depicts the device 10 after several process operations were performed. First, one or more recess etching processes were performed to remove upper portions of the various materials within the cavity 20 so as to form a gate-cap recess within the gate cavity 20. Then, a gate cap layer 31 was formed in the gate-cap recess above the recessed gate materials. The gate cap layer 31 is typically comprised of silicon nitride and it may be formed by depositing a layer of gate cap material so as to over-fill the gate-cap recess formed in the gate cavity and, thereafter, performing a CMP process to remove excess portions of the gate cap material layer positioned above the surface of the layer of insulating material 17. The gate cap layer 31 is formed so as to protect the underlying gate materials during subsequent processing operations.

As the gate length of transistor devices has decreased, the physical size of the gate cavity 20 has also decreased. Thus, it is becoming physically difficult to fit all of the layers of material needed for an HK/MG replacement gate structure 30 within such reduced-size gate cavities, particularly for NMOS devices, due to the greater number of layers of material that are typically used to form the HK/MG structures for the NMOS devices. For example, as gate lengths continue to decrease, voids or seams may be formed as the various layers of material are deposited into the gate cavity 20. FIG. 1F is a somewhat enlarged view of an illustrative NMOS device that is provided in an attempt to provide the reader with some idea of just how limited the lateral space 20S is within the gate cavity 20 of an NMOS device as the various metal layers 30A-30D are formed in the gate cavity 20. In FIG. 1F, the internal sidewall surfaces of the spacers 16 define a gate cavity 20 having a substantially uniform width 20S throughout the height or depth of the gate cavity 20. As the layers of material in the gate stack for the device are formed in the cavity 20, the remaining space 39 within the gate cavity 20 becomes very small. As the latter metal layers are formed, the lateral space 39 may be about 1-2 nm in width or even smaller. In some cases, the space 39 may be essentially non-existent. This may lead to a so-called "pinch-off" of metal layers such that voids or seams may be formed in the overall gate stack. Importantly, the formation of such voids or seams could lead to significant variations during the recessing of the materials of the gate structure. The presence of these voids and seams may ultimately result in devices that perform at levels less than anticipated or, in some cases, the formation of devices that are simply not acceptable and have to be discarded.

When manufacturing advanced integrated circuit products using HK/MG replacement gate structures, particularly in situations where the products also include very tight spacing between source/drain contact structures, such as products using self-aligned source/drain contacts, some amount of the work function metals in the gate cavity 20 must be removed from the gate cavity 20 to make room for additional materials, i.e., to make room within the upper portion of the gate cavity 20 for a bulk conductor material, such as tungsten and aluminum, and a gate cap layer. This process operation is sometimes referred to as work-function chamfering. In such a work-function chamfering process, some form of a protective material must be formed in the gate cavity 20 above the metal layer 30D to protect desired portions of the underlying metal layers during the work-function chamfering etching process. If the lateral space 39 (to the extent it exists) cannot be reliably filled with such a protective material, such as a flowable oxide material, then the work-function chamfering etching process cannot be performed for fear of removing needed portions of the metal layers during the course of performing the work-function chamfering etching process.

The present disclosure is directed to methods of forming replacement gate structures for semiconductor devices, such as transistors, and the resulting semiconductor devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to methods of forming replacement gate structures for semiconductor devices, such as transistors, and the resulting semiconductor devices. One method disclosed herein includes, among other things, forming first and second replacement gate cavities above a substrate, forming a high-k gate insulation layer in the first and second replacement gate cavities, forming a work-function adjusting metal layer in the first and second replacement gate cavities above the high-k gate insulation layer, forming a metal protection layer above the work-function adjusting layer in the first and second replacement gate cavities, the metal protection layer being formed so as to pinch-off the first gate cavity while leaving the second gate cavity partially un-filled, forming a first bulk conductive metal layer such that it is positioned within the un-filled portion of the second gate cavity above the metal protection layer while the first gate cavity is substantially free of the first bulk conductive metal layer, after forming the first bulk conductive metal layer, performing at least one etching process to selectively remove substantially all of the metal protection layer in the first gate cavity while leaving a portion of the metal protection layer in the second gate cavity, forming a second bulk conductive metal layer within the first and second replacement gate cavities, performing at least one recess etching process to recess the second bulk conductive metal layer within the first gate cavity and to recess the second bulk conductive metal layer and the first bulk metal conductive layer within the second gate cavity so as to define first and second gate-cap cavities in the first and second replacement gate cavities, respectively, and forming gate cap layers within the first and second gate-cap cavities.

Another illustrative method includes, among other things, forming a replacement gate cavity above the substrate, forming a high-k gate insulation layer in the replacement gate cavity, forming a work-function adjusting metal layer in the replacement gate cavity above the high-k gate insulation layer, forming a sacrificial metal protection layer above the work-function adjusting layer in the replacement gate cavity, the metal protection layer being formed so as to pinch-off the replacement gate cavity, performing at least one etching process to selectively remove substantially all of the sacrificial metal protection layer in the replacement gate cavity, after selectively removing substantially all of the sacrificial metal protection layer from the replacement gate cavity, forming a bulk conductive metal layer within the replacement gate cavity, performing at least one recess etching process to recess the bulk conductive metal layer within the replacement gate cavity so as to define a gate-cap cavity within the replacement gate cavity, and forming a gate cap layer within the replacement gate cavity.

Yet another illustrative method disclosed herein includes, among other things, forming a replacement gate cavity above the substrate, forming a high-k gate insulation layer in the replacement gate cavity, forming a work-function adjusting metal layer in the replacement gate cavity above the high-k gate insulation layer, forming a metal protection layer above the work-function adjusting layer in the replacement gate cavity, forming a first bulk conductive metal layer in the replacement gate cavity above the metal protection layer, after forming the first bulk conductive metal layer, performing at least one etching process to selectively remove a portion, but not all, of the metal protection layer in the replacement gate cavity, forming a second bulk conductive metal layer within the replacement gate cavity, performing at least one recess etching process to recess the second bulk conductive metal layer and the first bulk metal conductive layer within the replacement gate cavity so as to define a gate-cap cavity in the replacement gate cavity, and forming a gate cap layer within the gate-cap cavity.

One illustrative device disclosed herein includes, among other things, first and second gate structures positioned above a semiconductor substrate for first and second transistor devices, respectively, the first gate structure having a channel length less than 40 nm and the second gate structure having a channel length greater than 40 nm. In this embodiment, the first gate structure comprises a high-k gate insulation layer, at least one work-function adjusting metal layer positioned on the high-k gate insulation layer and a conductive gate electrode material positioned on the at least one work-function adjusting metal layer. This embodiment also includes a second gate structure comprised of the first high-k gate insulation layer, the at least one work-function adjusting metal layer positioned on the high-k gate insulation layer, a metal layer positioned on the at least one work-function adjusting metal layer and the conductive gate electrode material positioned on the metal layer and the at least one work-function adjusting metal layer.

BRIEF DESCRIPTION OF THE DRAWINGS

The disclosure may be understood by reference to the following description taken in conjunction with the accompanying drawings, in which like reference numerals identify like elements, and in which:

FIGS. 1A-1F depict one illustrative prior art method of forming an HK/MG gate structure of a transistor using a so-called "replacement gate" technique.

Figure 1C:
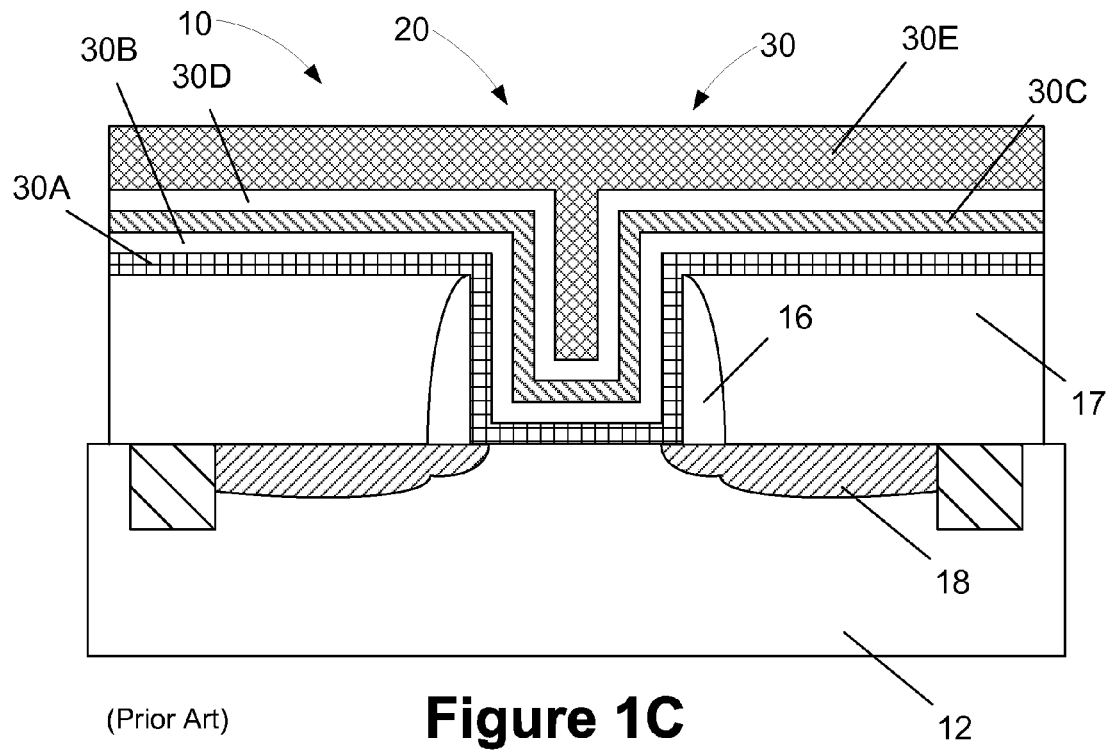
Figure 1D:
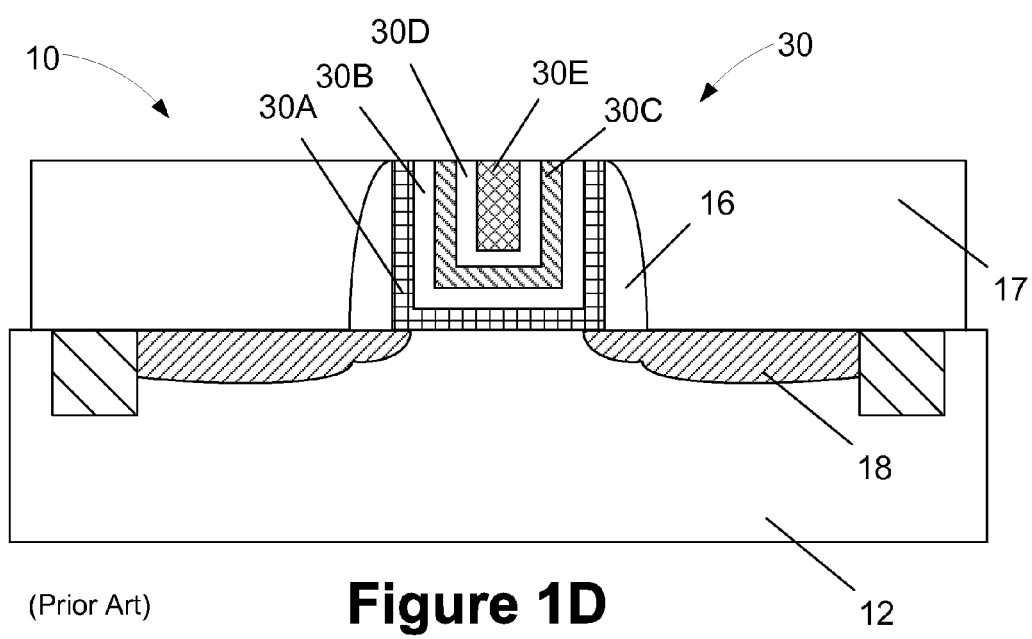
Figure 1F:
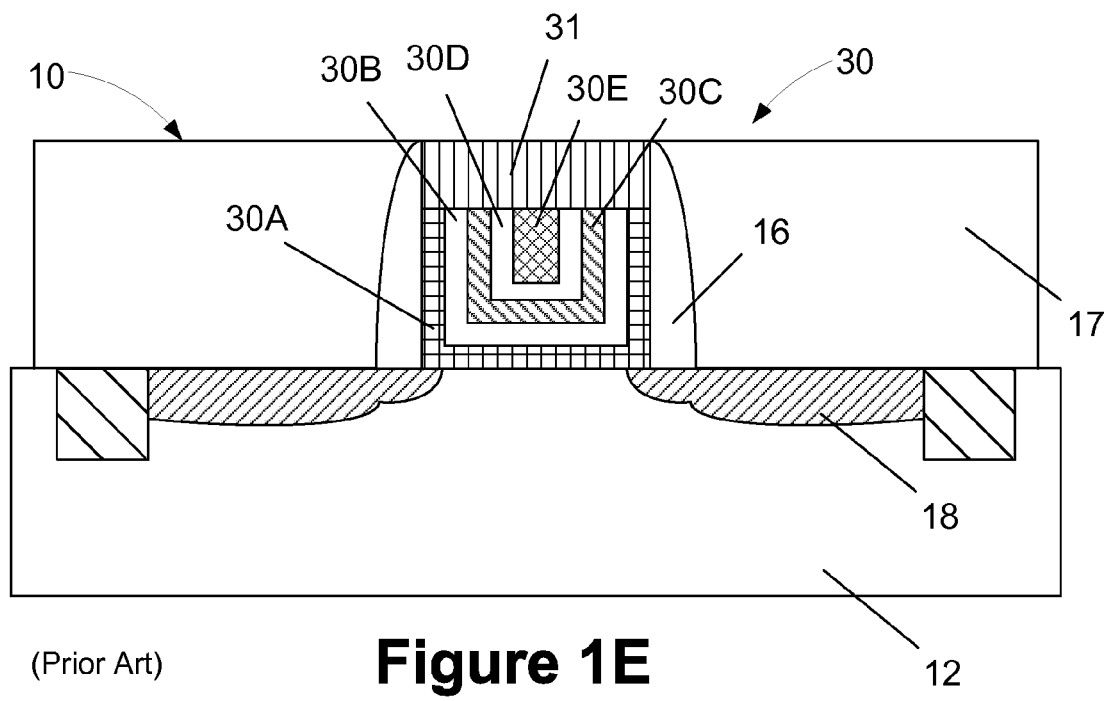
Figure 1F:
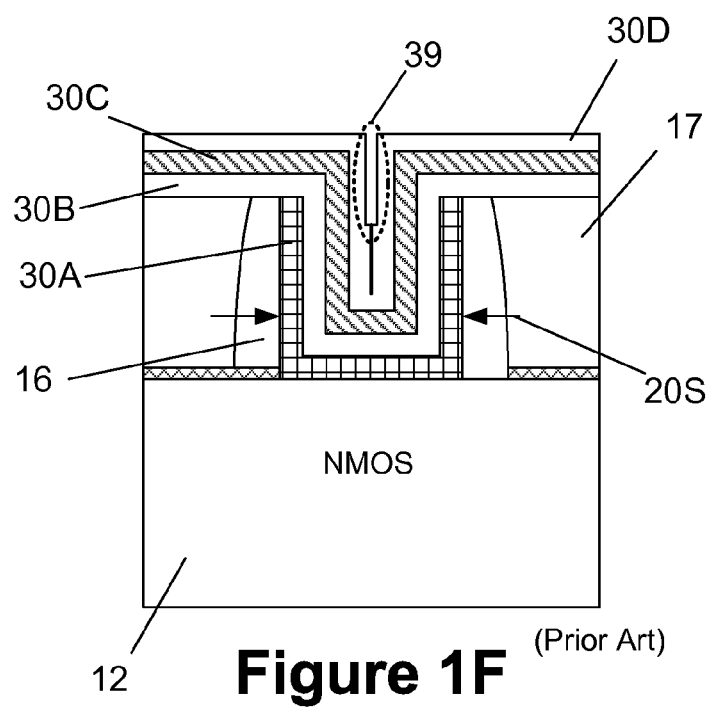

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure generally relates to various methods of forming replacement gate structures for semiconductor devices, such as transistors, and the resulting semiconductor devices. Moreover, as will be readily apparent to those skilled in the art upon a complete reading of the present application, the present method is applicable to a variety of devices, including, but not limited to, logic devices, memory devices, etc., and the methods disclosed herein may be employed to form N-type or P-type semiconductor devices. The methods and devices disclosed herein may be employed in manufacturing products using a variety of technologies, e.g., NMOS, PMOS, CMOS, etc., and they may be employed in manufacturing a variety of different devices, e.g., memory devices, logic devices, ASICs, etc. Of course, the inventions disclosed herein should not be considered to be limited to the illustrative examples depicted and described herein. With reference to the attached figures, various illustrative embodiments of the methods and devices disclosed herein will now be described in more detail.

As will be appreciated by those skilled in the art after a complete reading of the present application, the methods and structures disclosed herein may be used when forming any type of transistor device, e.g., planar devices, 3D transistor devices, nanowire devices, etc. An integrated circuit product 100 comprised of a plurality of illustrative planar transistor devices 101, 102 will be depicted for purposes of disclosing the subject matter set forth herein. Additionally, various doped regions, e.g., source/drain regions, halo implant regions, well regions and the like, are not depicted in the attached drawings. Of course, the inventions disclosed herein should not be considered to be limited to the illustrative examples depicted and described herein. Moreover, the transistor devices that are depicted in the attached drawings may be either NMOS or PMOS devices. The various components and structures of the integrated circuit product 100 disclosed herein may be formed using a variety of different materials and by performing a variety of known techniques, e.g., a chemical vapor deposition (CVD) process, an atomic layer deposition (ALD) process, a thermal growth process, spin-coating techniques, etc. The thicknesses of these various layers of material may also vary depending upon the particular application.

The illustrative integrated circuit product 100 depicted in the drawings is formed above an illustrative substrate 104 that may have a variety of configurations, such as the depicted bulk silicon configuration. The substrate 104 may also have a silicon-on-insulator (SOI) configuration that includes a bulk silicon layer, a buried insulation layer and an active layer, wherein semiconductor devices are formed in and above the active layer. Thus, the terms "substrate" or "semiconductor substrate" should be understood to cover all semiconducting materials and all forms of such materials.

Figure 2A:
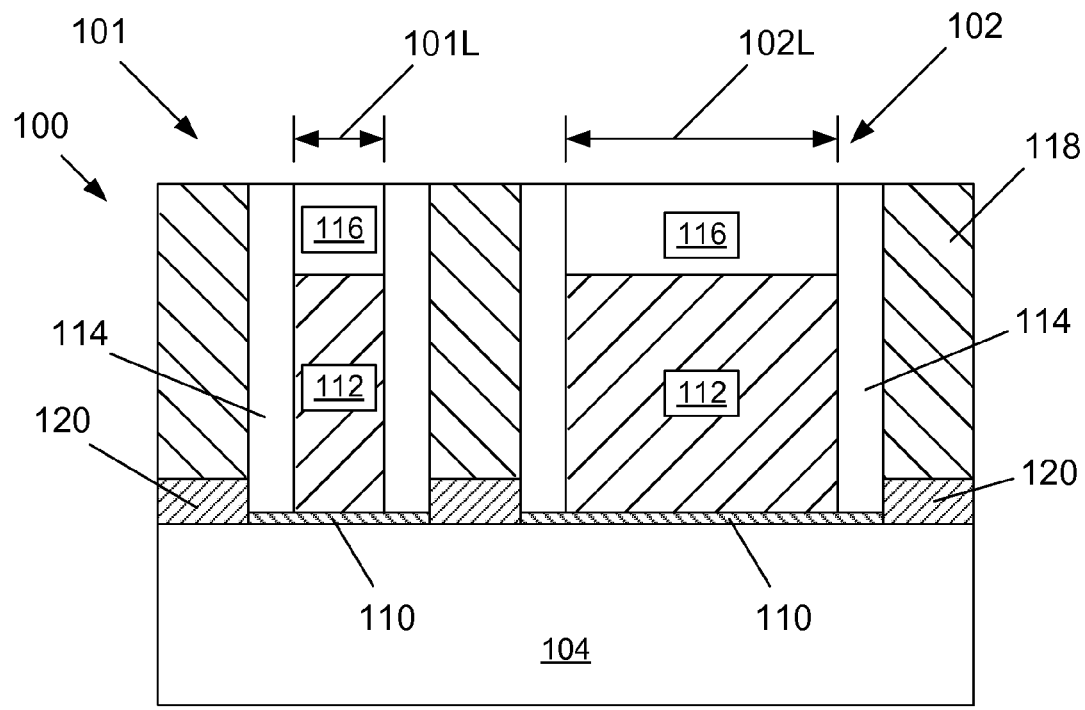
FIGS. 2A-2L depict various illustrative methods disclosed herein for various methods of forming replacement gate structures for semiconductor devices using a replacement gate technique and the resulting semiconductor devices.

In the examples disclosed herein, the gate structures of the transistor devices 101, 102 will be formed using a replacement gate technique. Accordingly, FIG. 2A depicts the integrated circuit product 100 at a point in fabrication wherein several layers of material and structures have been formed above the substrate 104. More specifically, at the point of fabrication depicted in FIG. 2A, the transistor devices 101, 102 include a sacrificial gate insulation layer 110, a dummy or sacrificial gate electrode 112, sidewall spacers 114 and an illustrative gate cap layer 116. Also depicted is a layer of insulating material 118 and raised source/drain regions 120. The transistor devices 101, 102 depicted in FIG. 2A may be comprised of a variety of different materials. For example, the sacrificial gate insulation layer 110 may be comprised of silicon dioxide, the sacrificial gate electrode 112 may be comprised of polysilicon or amorphous, the sidewall spacers 114 and the gate cap layer 116 may be comprised of silicon nitride and the layer of insulating material 118 may be comprised of silicon dioxide. The sidewall spacers 114 may be comprised of silicon nitride and they may formed by depositing a layer of spacer material and thereafter performing an anisotropic etching process to produce the spacers 114. Also depicted in FIG. 2A are regions of illustrative epi semiconductor material 120 that were formed in/or above the source/drain regions of the transistor devices 101, 102. Of course, such epi semiconductor material 120 need not be formed to practice the various inventions disclosed herein.

In the example depicted herein, the transistor devices 101, 102 have different channel lengths. More specifically, the channel length 101L of the transistor device 101 is less than the channel length 102L of the transistor device 102. Such a configuration is common on modern integrated circuit products that include transistor devices for many different types of circuits. In one illustrative embodiment, the channel length 101L may be about 40 nm or less, while the channel length 102L may be greater than 40 nm. In general, the transistor device 101 may be considered to be a "short-channel" device, while the transistor 102 may be considered to be a "long-channel" device.

Figure 2B:
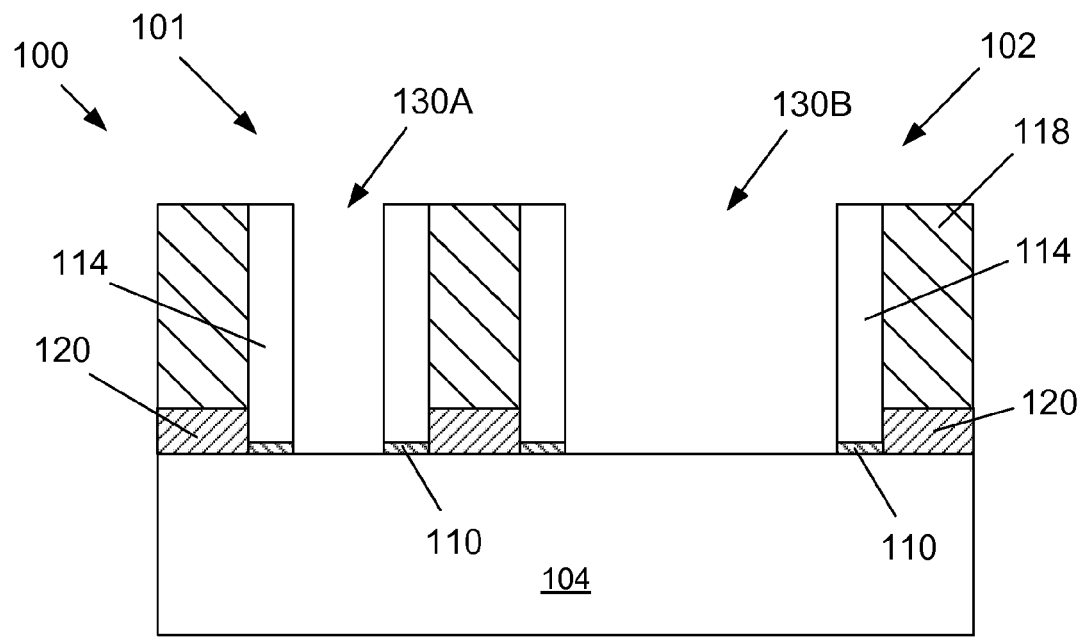

FIG. 2B depicts the integrated circuit product 100 after several process operations were performed. First, one or more chemical mechanical polishing (CMP) processes were performed to remove any materials above the sacrificial gate electrodes 112 (such as the protective cap layers 116) such that the upper surfaces of the sacrificial gate electrodes 112 were exposed. Thereafter, one or more wet or dry etching processes were performed to remove the sacrificial gate electrodes 112 and the sacrificial gate insulation layers 110 to thereby define replacement gate cavities 130A, 130B where HK/MG replacement gate structures (the final gate structures) will subsequently be formed for the transistor devices 101, 102, respectively. Typically, the sacrificial gate insulation layers 110 are removed as part of the replacement gate technique, as depicted herein. Even in cases where the sacrificial gate insulation layers 110 are intentionally removed, there will typically be very thin native oxide layers (not shown) that form on the surface of the substrate 104 within the replacement gate cavities 130A, 130B.

Figure 2C:
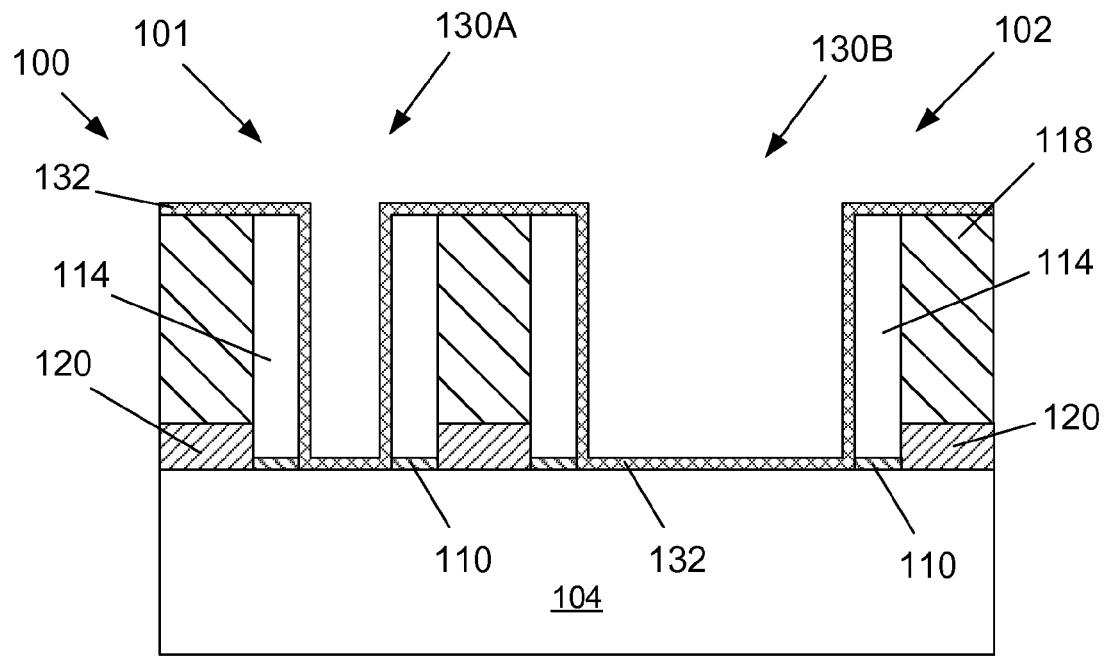

The next major process sequence involves formation of the replacement gate structure for the transistor devices 101, 102. The replacement gate structure that will be depicted herein is intended to be representative in nature of any type of gate structure that may be employed in manufacturing integrated circuit products using so-called gate-last (replacement gate) manufacturing techniques. Accordingly, with reference to FIG. 2C, a pre-clean process was performed in an attempt to remove all foreign materials from within the gate cavities 130A, 130B prior to forming the various layers of material that will become part of the HK/MG replacement gate structures. Next, a high-k (k value greater than 10) gate insulation layer 132, such as hafnium oxide (or the other high-k materials), was deposited across the integrated circuit product 100 and within the gate cavities 130A, 130B above the substrate 104 by performing a conformal deposition process. If desired, a thin interfacial layer of silicon dioxide (not shown) may be formed prior to the formation the high-k gate insulation layer 132. The thickness of the high-k gate insulation layer 132 may vary depending upon the particular application, e.g., 1-2 nm.

Figure 2D:
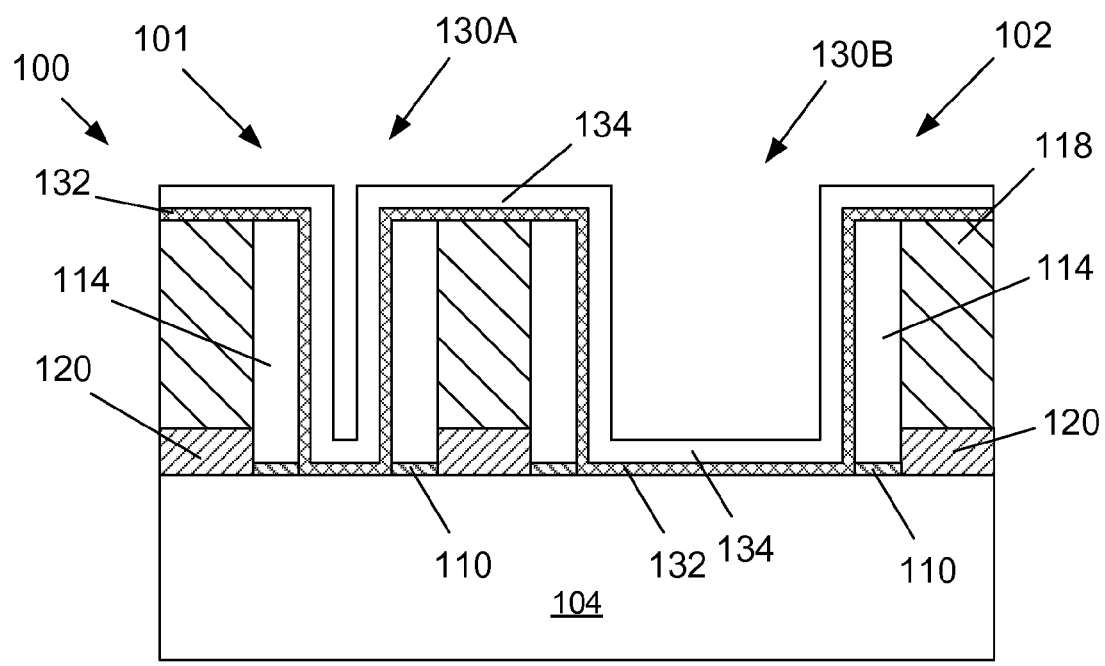

FIG. 2D depicts the integrated circuit product 100 after a representative work-function adjusting metal layer 134 was deposited across the integrated circuit product 100 and within the gate cavities 130A, 130B above the high-k gate insulation layer 132 by performing a conformal deposition process. It should be understood that the work-function adjusting metal layer 134 depicted herein may be comprised of one or more layers of metal depending upon the particular device under construction, i.e., the work-function adjusting metal layer 134 may include, for example, one or more layers of titanium (Ti), titanium nitride (TiN), titanium-aluminum (TiAl), titanium-aluminum-carbon (TiALC), aluminum (Al), aluminum nitride (AlN), tantalum (Ta), tantalum nitride (TaN), tantalum carbide (TaC), tantalum carbonitride (TaCN), tantalum silicon nitride (TaSiN), tantalum silicide (TaSi) and the like.

Figure 2E:
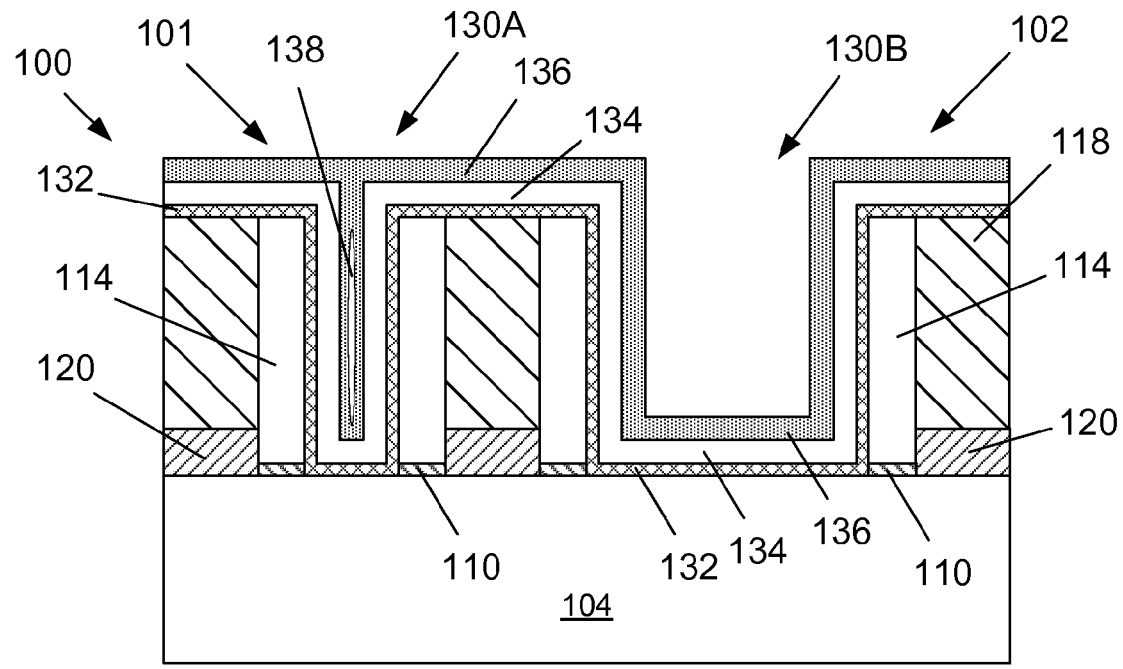

FIG. 2E depicts the integrated circuit product 100 after a representative metal protection layer 136 was deposited across the integrated circuit product 100 and within the gate cavities 130A, 130B above the work-function adjusting metal layer 134. Note that, with respect to the smaller channel device 101, the metal protection layer 136 is deposited until such time as "pinch-off" occurs in the gate cavity 130A. This is reflected by the presence of the illustrative void/seam 138 in FIG. 2E.

Figure 2F:
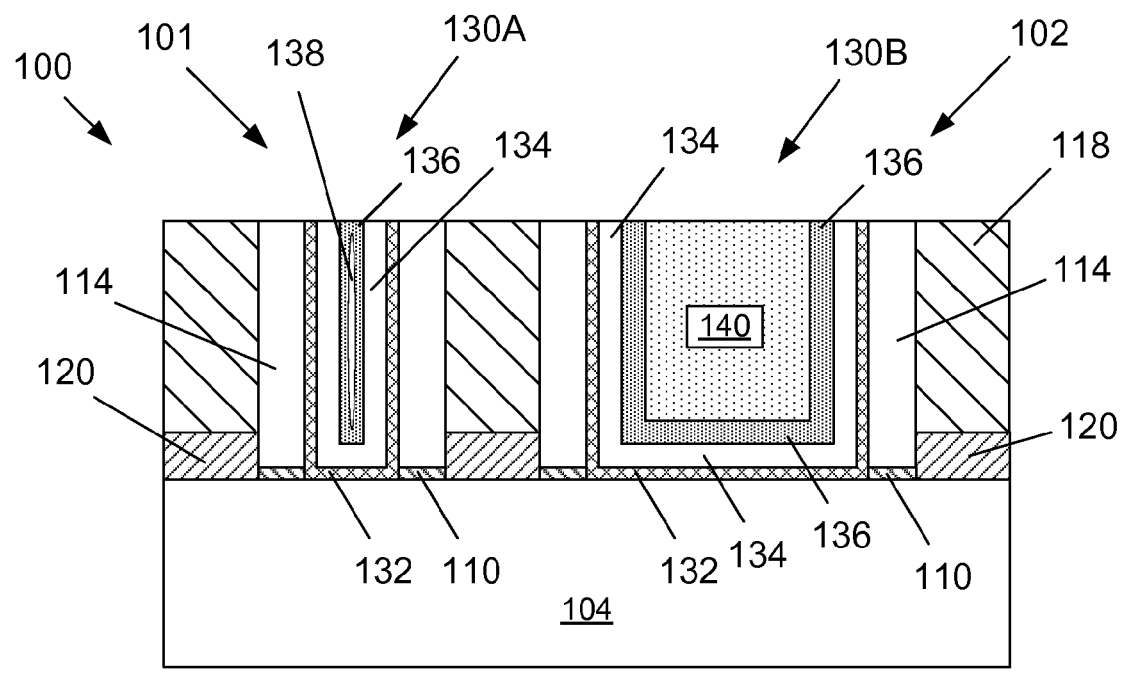

FIG. 2F depicts the integrated circuit product 100 after several process operations were performed. First, a bulk conductive material layer 140, such as tungsten or aluminum, was blanket-deposited above the substrate 104 so as to overfill the replacement gate cavity 130B for the transistor device 102. Due to the pinch-off of the gate cavity 130A, the gate cavity 130A is substantially free of the conductive material layer 140. Thereafter, one or more CMP processes were performed to planarize the upper surface of the layer of insulating material 118, which results in the removal of excess portions of the layers 140, 136, 134 and 132 positioned above the layer of insulating material 118.

Figure 2G:
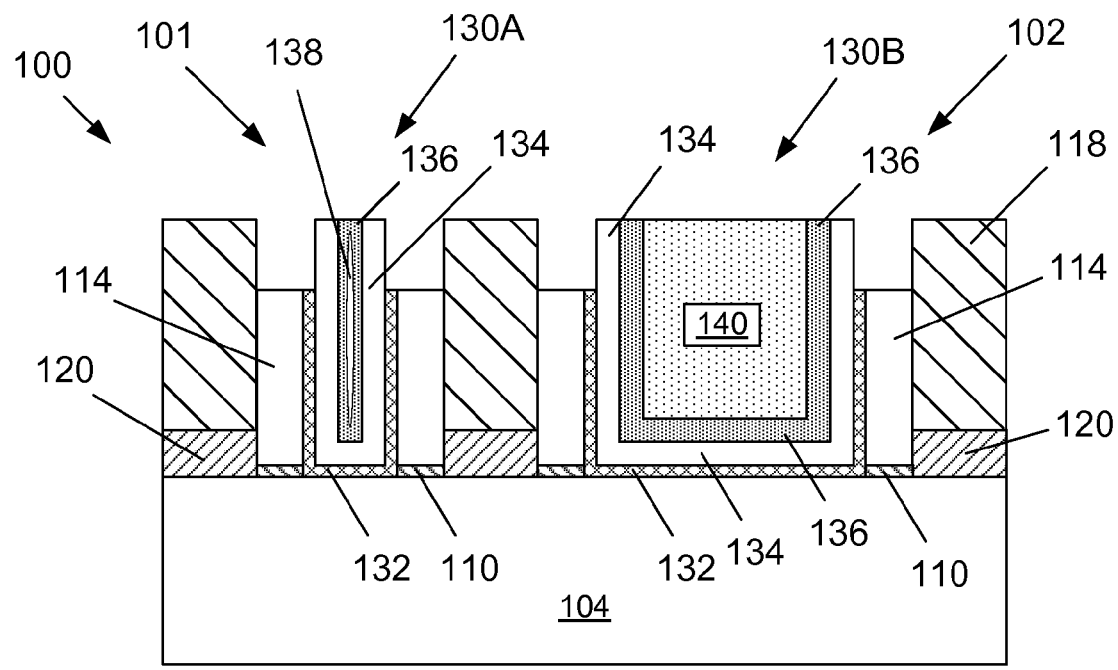

FIG. 2G depicts the integrated circuit product 100 after one or more wet or dry recess etching processes were performed to remove portions of the high-k gate insulation layer 132 and the spacers 114 selectively relative to the work-function adjusting metal layer 134, the metal protection layer 136 and bulk conductive material layer 140. Depending upon the particular application, these materials may be recessed to any desired depth, e.g., 30-50 nm. Such recess etching processes may be timed etching processes.

Figure 2H:
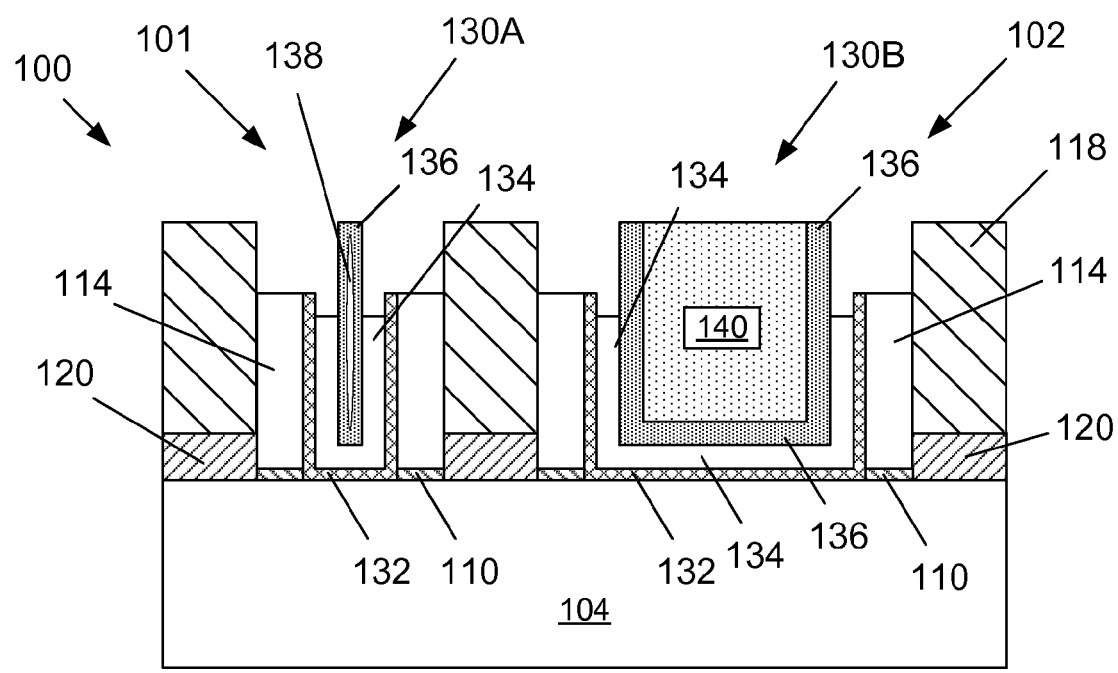

FIG. 2H depicts the integrated circuit product 100 after one or more wet or dry recess etching processes were performed to remove portions of the work-function adjusting metal layer 134 selectively relative to the high-k gate insulation layer 132, the spacers 114, the metal protection layer 136 and the bulk conductive material layer 140. Depending upon the particular application, the work-function adjusting metal layer 134 may be recessed below the upper surface of the recessed high-k gate insulation layer 132 by any desired distance, e.g., 5-20 nm. Such recessing may be accomplished by performing timed etching processes. For example, in the case where the work-function adjusting metal layer 134 is made of TiC and the metal protection layer 136 is made of TiN, the etching chemistry for a first selective etching process for removing TiC could be 1.5:26 SC1 at about 25° C., and the chemistry for a second selective etching process for removing TiN could be: 2.5:1 $H_2O_2$ at about 80° C.

Figure 2I:
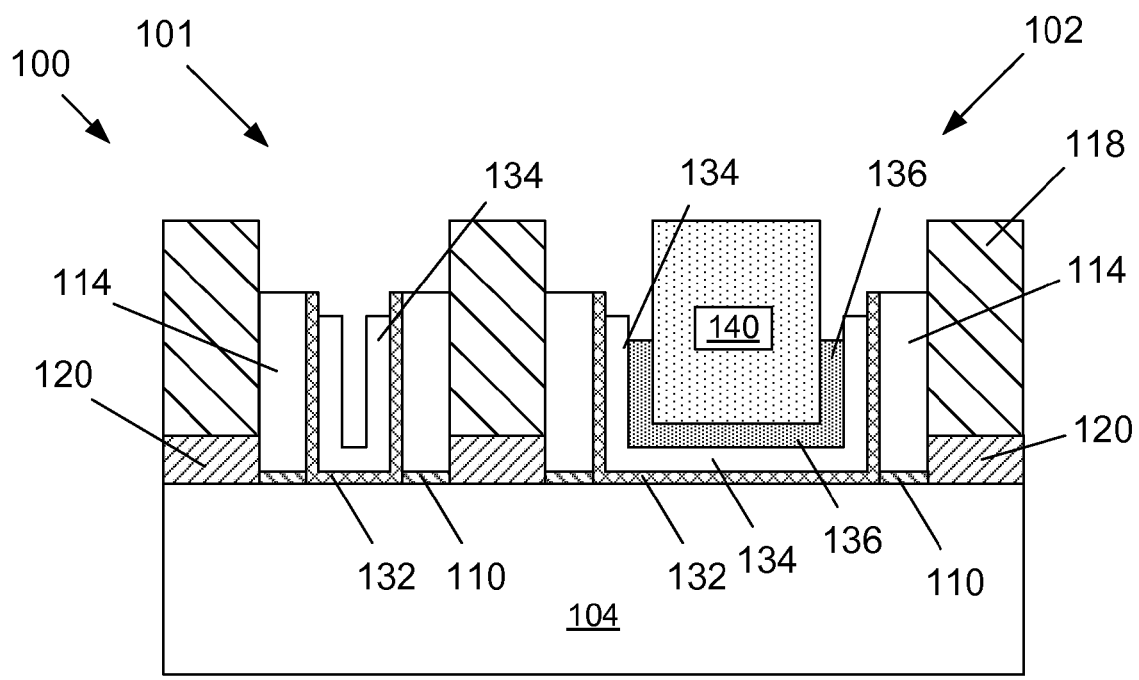

FIG. 2I depicts the integrated circuit product 100 after one or more wet or dry recess etching processes were performed to remove portions of the metal protection layer 136 selectively relative to the high-k gate insulation layer 132, the spacers 114, the work-function adjusting metal layer 134 and the bulk conductive material layer 140. Due to the relatively small amount of the metal protection layer 136 present in the gate cavity 130A of the small channel device 101, substantially all of the metal protection layer 136 may be removed from the gate cavity 130A, while portions of the metal protection layer 136 remain in the gate cavity 130B for the larger channel device 102. Within the gate cavity 130B, depending upon the particular application, the metal protection layer 136 may be recessed below the upper surface of the recessed work-function adjusting metal layer 134 by any desired distance, e.g., 5-20 nm. Such recessing may be accomplished by performing timed etching processes. As will be appreciated by those skilled in the art after a complete reading of the present application, the metal protection layer 136 is sacrificial in nature with respect to the transistor device 101. That is, in the depicted example, substantially all of the metal protection layer 136 is removed from the gate structure 130A of the transistor device 101.

Figure 2J:
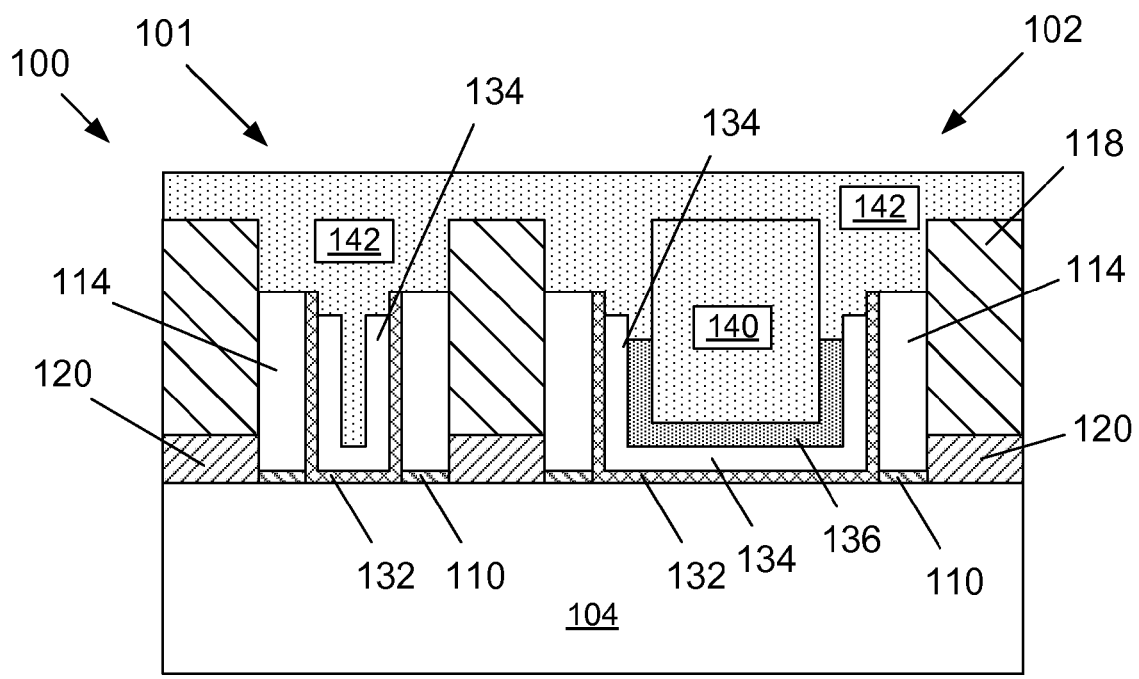

FIG. 2J depicts the integrated circuit product 100 after another bulk conductive material layer 142, such as tungsten or aluminum, was blanket-deposited above the substrate 104 so as to over-fill the gate cavities 130A, 130B. A different reference number "142" is provided for the second conductive material layer 142 merely to indicate that it is formed by performing another deposition process. In general, the conductive material layers 140, 142 may be made of the same material, although such a situation may not occur in all applications.

Figure 2K:
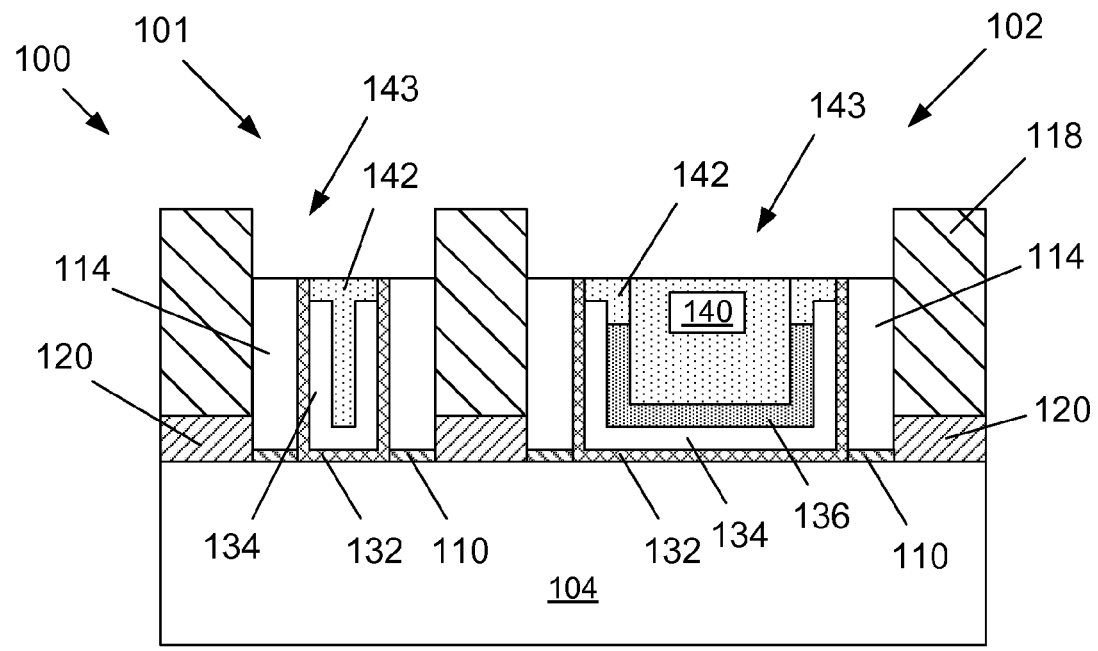

FIG. 2K depicts the integrated circuit product 100 after one or more wet or dry recess etching processes were performed to remove portions of the bulk conductive material layers 140, 142 selectively relative to the high-k gate insulation layer 132 and the spacers 114. This recessing defines gate-cap cavities 143 above the recessed conductive material layers 140, 142. The depth of the gate-cap cavities 143 may vary depending upon the particular application.

Figure 2L:
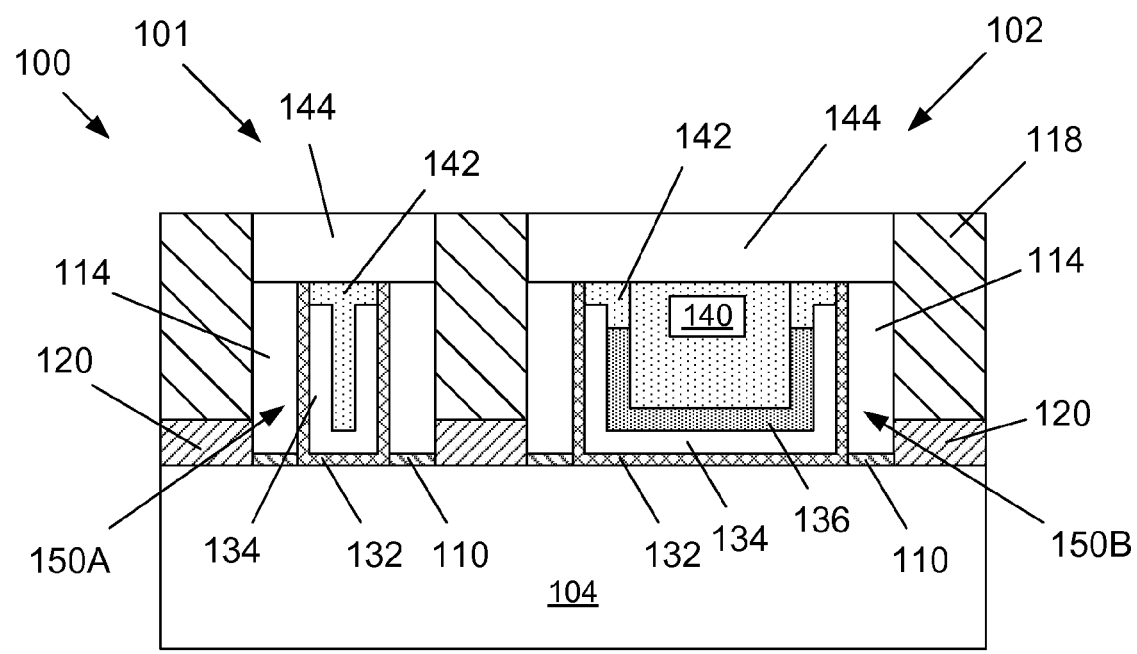

FIG. 2L depicts the integrated circuit product 100 after illustrative gate cap layers 144 were formed in the gate-cap cavities 143 above the recessed conductive material layers 140, 142. The gate cap layers 144 may be formed from a variety of material, e.g., typically silicon nitride. The gate cap layers 144 may be formed by depositing a layer of gate cap material so as to over-fill the gate-cap cavities 143 above the replacement gate structures 150A (for the device 101) and 150B (for the device 102) and, thereafter, performing a CMP process to remove excess portions of the gate cap material layer positioned above the surface of the layer of insulating material 118.

Note the unique configuration of the gate structure 150A of the short channel device 101 as compared to the configuration of the gate structure 150B of the long channel device 102. Due to the smaller gate cavity 130A of the short channel device 101, the metal protection layer 136 is substantially absent from the final high-k metal gate structure 150A, while portions of the metal protection layer 136 remain in the final high-k metal gate structure 150B of the long channel device 102, i.e., between portions of the work-function adjusting metal layer 134 and the bulk conductive layer 140.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method of forming replacement gate structures above a substrate, the method comprising:
    forming first and second replacement gate cavities above said substrate;
    forming a high-k gate insulation layer in said first and second replacement gate cavities;
    forming a work-function adjusting metal layer in said first and second replacement gate cavities above said high-k gate insulation layer;
    forming a metal protection layer above said work-function adjusting layer in said first and second replacement gate cavities, said metal protection layer being formed so as to pinch-off said first replacement gate cavity while leaving a portion of said second replacement gate cavity un-filled;
    forming a first bulk conductive metal layer such that it is positioned within said un-filled portion of said second replacement gate cavity above said metal protection layer while said first replacement gate cavity is substantially free of said first bulk conductive metal layer;
    after forming said first bulk conductive metal layer, performing at least one etching process to selectively remove substantially all of said metal protection layer in said first replacement gate cavity while leaving a portion of said metal protection layer in said second replacement gate cavity;
    forming a second bulk conductive metal layer within said first and second replacement gate cavities;
    performing at least one recess etching process to recess said second bulk conductive metal layer within said first replacement gate cavity and to recess said second bulk conductive metal layer and said first bulk metal conductive layer within said second replacement gate cavity so as to define first and second gate-cap cavities in said first and second replacement gate cavities, respectively; and
    forming gate cap layers within said first and second gate-cap cavities.

2. The method of claim 1, wherein said forming said high-k gate insulation layer comprises forming a layer of hafnium oxide.

3. The method of claim 1, wherein said forming said first and second bulk conductive material layers comprises forming said first and second bulk conductive material layers of the same conductive material.

4. The method of claim 1, wherein said forming said first and second replacement gate cavities comprises forming said first and second replacement gate cavities such that said first and second replacement gate cavities have different lateral dimensions.

5. The method of claim 1, wherein said forming said first and second replacement gate cavities comprises forming said first replacement gate cavity for a transistor having a gate length less than 40 nm and forming said second replacement gate cavity for a transistor having a gate length greater than 40 nm.

6. The method of claim 1, wherein said performing said at least one etching process to selectively remove substantially all of said metal protection layer in said first replacement gate cavity while leaving a portion of said metal protection layer in said second replacement gate cavity comprises:
performing at least one first recess etching process to remove portions of a sidewall spacer and portions of said high-k gate insulation layer positioned within or adjacent said first and second replacement gate cavities;
performing at least one second recess etching process to selectively remove portions of said work-function adjusting metal layer selectively relative to at least said high-k gate insulation layer and said metal protection layer within said first and second replacement gate cavities; and
performing at least one third recess etching process to selectively remove substantially all of said metal protection layer in said first replacement gate cavity while leaving a portion of said metal protection layer in said second replacement gate cavity.

7. A method of forming replacement gate structures above a substrate, the method comprising:
forming first and second replacement gate cavities above said substrate for first and second transistor devices, respectively, said first transistor device having a channel length of less than 40 nm, said second transistor device having a channel length that is greater than 40 nm;
forming a high-k gate insulation layer in said first and second replacement gate cavities;
forming a work-function adjusting metal layer in said first and second replacement gate cavities above said high-k gate insulation layer;
forming a metal protection layer above said work-function adjusting layer in said first and second replacement gate cavities, said metal protection layer being formed so as to pinch-off said first replacement gate cavity while leaving a portion of said second replacement gate cavity un-filled;
forming a first bulk conductive metal layer such that it is positioned within said un-filled portion of said second replacement gate cavity above said metal protection layer while said first replacement gate cavity is substantially free of said first bulk conductive metal layer;
performing at least one first recess etching process to remove portions of a sidewall spacer and portions of said high-k gate insulation layer positioned within or adjacent said first and second replacement gate cavities;
performing at least one second recess etching process to selectively remove portions of said work-function adjusting metal layer selectively relative to at least said high-k gate insulation layer and said metal protection layer within said first and second replacement gate cavities;
performing at least one third recess etching process to selectively remove substantially all of said metal protection layer in said first replacement gate cavity while leaving a portion of said metal protection layer in said second replacement gate cavity;
forming a second bulk conductive metal layer within said first and second replacement gate cavities;
performing at least one recess etching process to recess said second bulk conductive metal layer within said first replacement gate cavity and to recess said second bulk conductive metal layer and said first bulk metal conductive layer within said second replacement gate cavity so as to define first and second gate-cap cavities in said first and second replacement gate cavities, respectively; and
forming gate cap layers within said first and second gate-cap cavities.

8. A method of forming a replacement gate structure above a substrate, the method comprising:
forming a replacement gate cavity above said substrate;
forming a high-k gate insulation layer in said replacement gate cavity;
forming a work-function adjusting metal layer in said replacement gate cavity above said high-k gate insulation layer;
forming a sacrificial metal protection layer above said work-function adjusting layer in said replacement gate cavity, said sacrificial metal protection layer being formed so as to pinch-off said replacement gate cavity;
performing at least one etching process to selectively remove substantially all of said sacrificial metal protection layer in said replacement gate cavity;
after selectively removing substantially all of said sacrificial metal protection layer from said replacement gate cavity, forming a bulk conductive metal layer within said replacement gate cavity;
performing at least one recess etching process to recess said bulk conductive metal layer within said replacement gate cavity so as to define a gate-cap cavity within said replacement gate cavity; and
forming a gate cap layer within said replacement gate cavity.

9. The method of claim 8, wherein said forming said high-k gate insulation layer comprises forming a layer of hafnium oxide.

10. The method of claim 8, wherein said forming said replacement gate cavity comprises forming said replacement gate cavity for a transistor having a gate length less than 40 nm.

11. A method of forming a replacement gate structure above a substrate, the method comprising:
forming a replacement gate cavity above said substrate;
forming a high-k gate insulation layer in said replacement gate cavity;
forming a work-function adjusting metal layer in said replacement gate cavity above said high-k gate insulation layer;
forming a metal protection layer above said work-function adjusting layer in said replacement gate cavity;
forming a first bulk conductive metal layer in said replacement gate cavity above said metal protection layer;
after forming said first bulk conductive metal layer, performing at least one etching process to selectively remove a portion, but not all, of said metal protection layer in said replacement gate cavity;

forming a second bulk conductive metal layer within said replacement gate cavity;

performing at least one recess etching process to recess said second bulk conductive metal layer and said first bulk metal conductive layer within said replacement gate cavity so as to define a gate-cap cavity in said replacement gate cavity; and forming a gate cap layer within said gate-cap cavity.

12. The method of claim 11, wherein said forming said high-k gate insulation layer comprises forming a layer of hafnium oxide.

13. The method of claim 11, wherein said forming said first and second bulk conductive material layers comprises forming said first and second bulk conductive material layers of the same conductive material.

14. The method of claim 11, wherein said forming said replacement gate cavity comprises forming said replacement gate cavity for a transistor having a gate length greater than 40 nm.

15. The method of claim 11, wherein said performing said at least one etching process to selectively remove a portion, but not all, of said metal protection layer in said replacement gate cavity comprises:

performing at least one first recess etching process to remove portions of a sidewall spacer and portions of said high-k gate insulation layer positioned within or adjacent said replacement gate cavity;

performing at least one second recess etching process to selectively remove portions of said work-function adjusting metal layer selectively relative to at least said high-k gate insulation layer and said metal protection layer within said replacement gate cavity; and performing at least one third recess etching process to selectively remove said portions, but not all, of said metal protection layer in said replacement gate cavity.

* * * * *